United States Patent [19]

Madono et al.

[11] Patent Number: 5,229,193
[45] Date of Patent: Jul. 20, 1993

[54] SILICON CARBIDE MEMBER

[75] Inventors: Junji Madono; Michio Hayashi; Fukuji Matsumoto, all of Takefu, Japan

[73] Assignee: Shin-Etsu Chemical Co., Ltd., Tokyo, Japan

[21] Appl. No.: 608,836

[22] Filed: Nov. 5, 1990

[30] Foreign Application Priority Data

Nov. 10, 1989 [JP] Japan ............................ 1-293066

[51] Int. Cl.⁵ .................................................. B32B 7/02
[52] U.S. Cl. .................................... 428/212; 428/216; 428/469; 428/472; 428/698
[58] Field of Search ............... 428/408, 446, 698, 472, 428/469, 216, 212

[56] References Cited

U.S. PATENT DOCUMENTS

| | | | |
|---|---|---|---|
| 3,189,477 | 6/1965 | Shaffer | 428/698 |
| 3,317,356 | 5/1967 | Cleudinning | 428/698 |
| 3,900,592 | 8/1975 | Kennedy et al. | 428/212 |
| 3,925,577 | 12/1975 | Fatzer et al. | 428/408 |
| 4,226,914 | 10/1980 | Terner et al. | 428/428 |
| 4,289,822 | 9/1981 | Shimada et al. | 428/446 |
| 4,425,407 | 1/1984 | Galasso et al. | 428/408 |
| 4,476,178 | 10/1984 | Veltii et al. | 428/408 |
| 4,608,326 | 8/1986 | Neukermans et al. | 428/698 |
| 4,617,232 | 10/1986 | Chandler et al. | 428/698 |
| 4,634,635 | 1/1987 | Shiraishi et al. | 428/698 |
| 4,783,368 | 11/1988 | Yamamoto et al. | 428/408 |
| 4,843,040 | 7/1989 | Oda et al. | 428/446 |

FOREIGN PATENT DOCUMENTS

| | | |
|---|---|---|
| 1302312 | 3/1972 | Fed. Rep. of Germany . |
| 1479015 | 3/1967 | France . |
| 0643166 | 5/1984 | Switzerland . |

OTHER PUBLICATIONS

Patent Abstracts of Japan, vol. 12, No. 353 (C-530) 3200 Sep. 21, 1988.
Patent Abstracts of Japan, vol. 11, No. 106 (C-414) 2553, Apr. 3, 1987.
Chem. Abstracts, vol. 107, No. 26, Dec. 1987, pp. 148; No. 239321v.

*Primary Examiner*—Ellis P. Robinson
*Assistant Examiner*—A. A. Turner
*Attorney, Agent, or Firm*—Birch, Stewart, Kolasch & Birch

[57] ABSTRACT

A silicon carbide member is manufactured by depositing a silicon carbide coating on a substrate of silicon carbide containing free silicon by chemical vapor deposition. By gradually reducing the content of free silicon of the coating such that the coating is made of silicon carbide containing free silicon at the interface with the substrate, but of silicon carbide containing no free silicon at the outer surface, the coating is firmly bonded to the substrate, undergoes little thermal stress and is resistant against cracking and separation upon thermal cycling. The member is suitable for use in the heat treatment of semiconductor elements.

6 Claims, 1 Drawing Sheet

SILICON CARBIDE MEMBER

This invention relates to silicon carbide members, and more particularly, to silicon carbide members suitable for use in semiconductor heat treatment, for example, wafer boats, mother boats, liner tubes, process tubes, cantilevers, forks and other members which are to be exposed to high temperatures.

BACKGROUND OF THE INVENTION

The manufacture of semiconductor elements often uses silicon carbide members, for example, wafer boats, mother boats, liner tubes, process tubes, paddles, cantilevers, and forks in heat treatment steps. The semiconductor manufacture places high purity requirements on these silicon carbide members in order to prevent contamination of semiconductor elements. In particular, the heat treatment of semiconductor elements in diffusion furnaces is accompanied by an increased likelihood that semiconductor elements be contaminated by the diffusion of impurities in the members. It is thus very important to prevent impurity diffusion. It has been a common practice to form high purity silicon carbide coatings on the surface of silicon carbide substrates by chemical vapor deposition (CVD) techniques for preventing diffusion of impurities from within the members.

Although the substrate and coating of these silicon carbide members are made of the same material, there is a difference in coefficient of thermal expansion therebetween due to a slight compositional difference therebetween. Since thermal stresses can develop between the substrate and the coating during heat treatment, repeated heat treatments will cause the coating to separate from the substrate. More particularly, silicon carbide substrates are often made of silicon carbide impregnated with metallic silicon, known as SiC-Si, which generally has a coefficient of thermal expansion of $4.3$–$4.5 \times 10^{-6}/°C$. High purity silicon carbide (SiC) coatings formed by CVD have a coefficient of thermal expansion of $4.5$–$4.9 \times 10^{-6}/°C$. which is higher than that of the SiC-Si. The differential thermal expansion between SiC-Si substrates and SiC coatings formed thereon by CVD can induce thermal stresses in the SiC coatings during heat treatment. Since thermal cycles are repeated in practice, such repetitive stresses lead to frequent occurrence of cracks and separation. Therefore, members comprising free silicon impregnated silicon carbide substrates having high purity silicon carbide coatings formed by CVD suffer from a relatively short effective life.

Other prior art proposals include a coating having a multilayer structure of silicon carbide (SiC) and silicon nitride (SiN) layers (Japanese Patent Publication No. 45154/1985) and an SiC multilayer structure (Japanese Patent Application Kokai No. 84427/1983). These structures could increase the strength of coatings themselves although no attention was paid to the differential thermal expansion between substrates and coatings, which suggests that their effective life is not satisfactory.

SUMMARY OF THE INVENTION

Therefore, an object of the present invention is to provide a silicon carbide member comprising a free silicon containing silicon carbide substrate supporting a silicon carbide coating which has sufficiently minimized differential thermal expansion between the substrate and the coating to prevent separation of the coating from the substrate or cracking of the coating due to differential thermal expansion, while restraining diffusion of impurities therefrom. Another object of the present invention is to provide such a silicon carbide member having an extended effective life.

According to the present invention, there is provided a silicon carbide member comprising a substrate made of silicon carbide containing free silicon supporting a silicon carbide coating. The silicon carbide coating is formed on the surface of the substrate by a chemical vapor deposition technique. The coating includes an inner layer from the interface with the substrate and an outer layer having an exposed outer surface. Optionally, an intermediate layer or layers may be present between the inner and outer layers. The inner layer is made of silicon carbide containing free silicon. The content of free silicon gradually decreases from the interface toward the outer surface. The outer layer is made of silicon carbide without free silicon. Preferably, the content of free silicon decreases continuously or stepwise from the interface toward the outer surface.

It will be understood that the terms inner, intermediate and outer layers are used merely for convenience of description because these layers are contiguous to each other.

More particularly, the silicon carbide coating has such a high content of free silicon near the interface with the substrate that its coefficient of thermal expansion near the interface is substantially equal to that of the substrate. Therefore the silicon carbide coating is less susceptible to thermal stresses at the interface. In the interior of the coating, only minimal stresses will occur between adjacent layers. Any thermally induced stresses are alleviated by the intermediate layer so that the coating as a whole experiences minimal stresses. Any thermal stresses are alleviated and buffered in the coating particularly when the content of free silicon varies continuously. Therefore, the coating is not only resistant to thermal impact and heat, but experiences least loss of adhesion force due to thermal fatigue, thus maintaining a long effective life. Therefore, silicon carbide members having such coatings formed thereon are least susceptible to cracking or stripping of the coatings during repeated thermal cycles. The members have an exposed surface defined by an extremely high purity silicon carbide layer which contains little or no free silicon, and thus avoid any inconvenience such as impurity diffusion during heat treatment. The members can be repeatedly used in heat treatment for a long period of time.

BRIEF DESCRIPTION OF THE DRAWINGS

The above and other objects, features, and advantages of the present invention will be better understood from the following description taken in conjunction with the accompanying drawings, in which.

DESCRIPTION OF THE PREFERRED EMBODIMENTS

Figure 1:
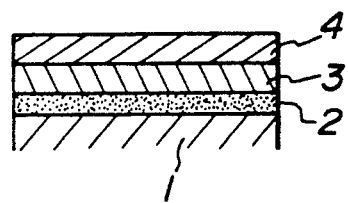
FIGS. 1 and 2 are cross-sectional views of silicon carbide members according to different embodiments of the present invention.

In the silicon carbide member according to the present invention, there is prepared a substrate made of silicon carbide containing free silicon. Such substrates are typically prepared by impregnating silicon carbide with metallic silicon as disclosed in U.S. Pat. No. 3,951,587. The silicon carbide substrates generally contain about 5 to 30%, preferably 10 to 22% by weight of free Si, the balance being SiC.

A silicon carbide coating is formed on the surface of the substrate by a gas phase chemical vapor deposition (CVD) technique such that the coating consists essentially of inner, optional intermediate and outer layers from the interface with the substrate to an outer surface. The inner layer at the interface is made of silicon carbide containing free silicon. The content of free silicon gradually decreases from the interface toward the outer surface. The content of free silicon may decrease continuously or stepwise from the interface toward the outer surface. The stepwise reduction of free silicon content provides a multilayer structure. Such free silicon distribution minimizes not only the differential thermal expansion at the interface between the substrate and the coating, but also stress generation in the coating, thereby preventing the coating from stripping or cracking at high temperatures. The outer layer is made of silicon carbide containing no or little free silicon. Therefore, the silicon carbide member bearing such a coating having a controlled distribution of free silicon avoids any inconvenience like impurity diffusion during heat treatment of semiconductor elements resting on the member and allows stable heat treatment to be repeated for a long period of time.

A multilayer structure is provided when the content of free silicon is reduced stepwise. Preferred is a two-layer structure of inner and outer layers. The inner layer of the coating adjoining the substrate is made of silicon carbide containing free silicon in an amount which is approximately one half of the free silicon content of the silicon carbide substrate. That is, the inner layer typically contains about 2 to 20%, preferably 3 to 15%, more preferably 5 to 10% by weight of free Si, the balance being SiC. The outer or surface layer is made of silicon carbide containing no free silicon. This two-layer structure is effective in preventing separation of the coating upon thermal cycling. Preferably, the inner layer has a thickness of 10 to 300 $\mu$m, more preferably 50 to 200 $\mu$m, and the outer layer has a thickness of 10 to 300 $\mu$m, more preferably 50 to 200 $\mu$m.

More preferred is a three or multi-layer structure including one or more intermediate layers between the inner and outer layers mentioned above. Also preferably in this case, the inner layer has a thickness of at least 10 $\mu$m, more preferably 10 to 100 $\mu$m, the intermediate layer or layers have a (total) thickness of at least 10 $\mu$m, more preferably 10 to 100 $\mu$m, and the outer layer has a thickness of 10 to 300 $\mu$m, more preferably 50 to 200 $\mu$m. The free silicon contents of the outer and inner layers are the same as above. The intermediate layer(s) may have an inter mediate value such that the content of free silicon gradually decreases toward the outer surface.

Preferably, the entire coating having such a layered structure has a thickness of 20 to 500 $\mu$m, more preferably 100 to 300 $\mu$m.

Where the content of free silicon decreases continuously from the interface toward the outer surface, the coating appears to be a single layer coating. The interface between adjoining two of the inner, intermediate and outer layers is not definitely perceivable when the content of free silicon varies continuously. The free silicon content near the interface with the substrate may vary from a level substantially equal to that of the substrate to one half of that of the substrate, that is, often from 2 to 30%, preferably from 5 to 20%, more preferably from 5 to 10% by weight. The coating preferably has a thickness of 20 to 500 $\mu$m, more preferably 100 to 300 $\mu$m while the outer or surface layer of silicon carbide containing little or no free silicon has a thickness of 10 to 300 $\mu$m, more preferably 50 to 200 $\mu$m.

The silicon carbide coating is formed by a CVD technique according to the present invention. The gas source used herein may be a reactant or reactant mixture such as $CH_3SiCl_3$, $CH_3SiHCl_2$, $(CH_3)_2SiCl_2$, $SiCl_4+CH_4$, and $SiCl_4+C_3H_8$. A silicon carbide substrate is placed in a CVD furnace through which the reactant gas is passed whereby a coating is formed on the substrate. The furnace is generally maintained at a temperature of 1,000° to 1,400° C. and an atmospheric or reduced pressure. The content of free silicon in the coating may be controlled by changing the concentration and flow rate of the reactant gas, pressure and temperature. For example, in a ($SiCl_4+CH_4+H_2$) system, the concentration of free Si can be decreased by decreasing the $SiCl_4$ concentration and/or lowering the temperature. There is obtained a coating in which the free silicon content varies in a thickness direction in a multilayer structure manner or continuously.

The silicon carbide members of the present invention are useful for the heat treatment of semiconductor elements as well as any applications where the members are exposed to high temperatures. The members have silicon carbide coatings which are deposited onto substrates in a compatible manner to prevent separation and occurrence of cracks and other undesirable defects of the coating upon thermal cycling, thus ensuring a long effective life, and which present a highly pure silicon carbide surface to prevent impurities from diffusing out.

There has been described silicon carbide members having silicon carbide coatings which are deposited onto substrates in such a manner to prevent separation and cracking of the coating upon repetitive thermal cycling, leading to a long effective life. In addition, the silicon carbide coatings have a highly pure silicon carbide surface through which no or little impurities will diffuse out during heat treatment of semiconductor elements which rest on or contact with the members. The silicon carbide members of the invention can be repeatedly used in the heat treatment of semiconductor elements in a stable manner without a failure of themselves or an undesirable influence on the elements to be heat treated.

EXAMPLES

Examples of the present invention are given below by way of illustration and not by way of limitation. All percents are by weight.

Examples 1 to 3

There were prepared three substrates (50×50×10 mm) made of silicon carbide containing 20% of free silicon. Using a CVD technique, silicon carbide coatings of 200 $\mu$m thick were deposited on the substrates to the structures shown in FIGS. 1, 2, and 3. The source gas was a mixture of $SiCl_4+CH_4+H_2$, the temperature was controlled over the range of from 1200° to 1350° C., and the pressure was controlled over the range of from 10 to 60 Torr.

Example 1 was a coating of the three layer structure shown in FIG. 1 in which an inner layer 2 of SiC-Si containing 10% of free silicon (50 μm thick), an intermediate layer 3 of SiC-Si containing 5% of free silicon (50 μm thick), and an outer layer 4 of SiC containing no free silicon (100 μm thick) were successively deposited on a substrate 1.

Figure 2:
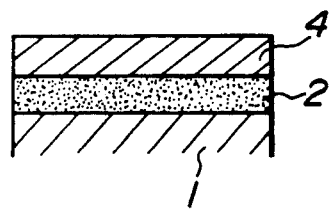

Example 2 was a coating of the two layer structure shown in FIG. 2 in which an inner layer 2 of SiC-Si containing 10% of free silicon (100 μm thick) and an outer layer 4 of SiC containing no free silicon (100 μm thick) were successively deposited on a substrate 1.

Figure 3:
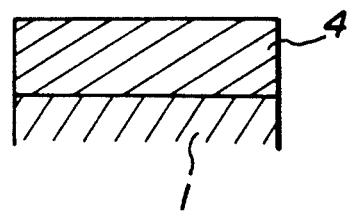
FIG. 3 is a cross sectional view of a prior art silicon carbide member.

Example 3 was a coating of the single layer structure shown in FIG. 3 in which a layer 4 of SiC containing no free silicon (200 μm thick) was deposited on a substrate 1. Example 3 is outside the scope of the invention.

Silicon carbide members having three different coatings were prepared in this way. They were subjected to a thermal cycling test between 1200° C. and room temperature by moving them into and out of a furnace at 1200° C. in the ambient atmosphere. The number of thermal cycles at which the coating cracked and at which the coating separated off were determined. The results are shown below.

|  | Example | | |
| --- | --- | --- | --- |
|  | 1 | 2 | 3 |
| Cycles until cracking | >300 | 261 | —* |
| Cycles until separation | >300 | >300 | 231 |

*The coating separated prior to cracking.

It is evident that the silicon carbide coatings according to the present invention are more resistant against thermal cycling than the prior art single layer coating.

Although some preferred embodiments have been described, many modifications and variations may be made thereto in the light of the above teachings. It is therefore to be understood that within the scope of the appended claims, the invention may be practiced otherwise than as specifically described.

We claim:

1. A silicon carbide member comprising:
   a substrate consisting essentially of silicon carbide containing 5 to 30% by weight of free silicon, and
   a silicon carbide coating formed on a surface of said substrate by a chemical vapor deposition technique;
   said silicon carbide comprising an inner layer having an interface with said substrate and an outer layer having an exposed outer surface, said inner layer consisting essentially of silicon carbide containing free silicon in an amount of approximately one half of the free silicon content of said substrate and having a thickness of 10 to 300 μm, said outer layer consisting essentially of silicon carbide containing no free silicon and having a thickness of 10 to 300 μm, and the total thickness of said coating being in the range of 20 to 500 μm;
   wherein a differential of thermal expansion between the substrate and the coating is minimal and a separating of the coating from the substrate or a cracking of the coating due to the differential of thermal expansion is prevented, and wherein the coating restrains diffusion of impurities therefrom.

2. The member of claim 1, wherein the silicon carbide coating contains at least one intermediate layer between said inner and outer layers.

3. The member of claim 2, wherein the content of free silicon in the inner layer decreases continuously from the substrate interface toward the outer layer.

4. The member of claim 2, wherein the content of free silicon in the coating decreases stepwise from the substrate interface toward the outer layer.

5. The member of claim 1, wherein the content of free silicon in the inner layer decreases continuously from the substrate interface toward the outer layer.

6. The member of claim 1, wherein the content of free silicon in the coating decreases stepwise from the substrate interface toward the outer layer.

* * * * *